United States Patent
Han et al.

(10) Patent No.: US 11,935,984 B2
(45) Date of Patent: Mar. 19, 2024

(54) SEMICONDUCTOR NANOCRYSTAL PARTICLE, METHOD FOR PREPARING SAME, AND DEVICE INCLUDING SAME

(71) Applicant: SAMSUNG ELECTRONICS CO., LTD., Suwon-si (KR)

(72) Inventors: Yong Seok Han, Anyang-si (KR); Sung Woo Kim, Hwaseong-si (KR); Jin A Kim, Suwon-si (KR); Tae Hyung Kim, Seoul (KR); Kun Su Park, Seongnam-si (KR); Yuho Won, Seoul (KR); Jeong Hee Lee, Seongnam-si (KR); Eun Joo Jang, Suwon-si (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/065,910

(22) Filed: Dec. 14, 2022

(65) Prior Publication Data
US 2023/0114604 A1  Apr. 13, 2023

Related U.S. Application Data

(62) Division of application No. 16/998,262, filed on Aug. 20, 2020, now Pat. No. 11,563,143.

(30) Foreign Application Priority Data

Aug. 30, 2019  (KR) .............................. 2019-0107637

(51) Int. Cl.
*H01L 33/06* (2010.01)
*C01B 19/04* (2006.01)
(Continued)

(52) U.S. Cl.
CPC .............. *H01L 33/06* (2013.01); *C01B 19/04* (2013.01); *C09K 11/88* (2013.01); *H01L 33/20* (2013.01); *H01L 33/26* (2013.01)

(58) Field of Classification Search
CPC ......... C01B 19/04; C09K 11/88; H01L 33/06; H01L 33/20; H01L 33/26; H01L 33/02
See application file for complete search history.

(56) References Cited

U.S. PATENT DOCUMENTS 8,963,119 B2    2/2015  Jang et al.
9,698,311 B2 *  7/2017  Greco ................. B01J 13/0004
(Continued)

FOREIGN PATENT DOCUMENTS

KR       1692001 B1    12/2016
KR    20170074585 A     6/2017

OTHER PUBLICATIONS

Aqiang Wang, et al., Bright, efficient, and color-stable violet ZnSe-based quantum dot light-emitting diodes, Nanoscale, 2015, 7, 2951-2959.
(Continued)

*Primary Examiner* — Mark W Tornow
(74) *Attorney, Agent, or Firm* — CANTOR COLBURN LLP

(57) ABSTRACT

A quantum dot including a core that includes a first semiconductor nanocrystal including zinc and selenium, and optionally sulfur and/or tellurium, and a shell that includes a second semiconductor nanocrystal including zinc, and at least one of sulfur or selenium is disclosed. The quantum dot has an average particle diameter of greater than or equal to about 13 nm, an emission peak wavelength in a range of about 440 nm to about 470 nm, and a full width at half maximum (FWHM) of an emission wavelength of less than about 25 nm. A method for preparing the quantum dot, a quantum dot-polymer composite including the quantum dot, (Continued)

and an electronic device including the quantum dot is also disclosed.

19 Claims, 13 Drawing Sheets

(51) Int. Cl.
*C09K 11/88* (2006.01)
*H01L 33/20* (2010.01)
*H01L 33/26* (2010.01)

(56) References Cited

U.S. PATENT DOCUMENTS

| | | |
|---|---|---|
| 10,074,770 B2 | 9/2018 | Park et al. |
| 10,559,712 B2 | 2/2020 | Park et al. |
| 2019/0071603 A1 | 3/2019 | Qian et al. |
| 2019/0276737 A1 | 9/2019 | Won et al. |
| 2020/0220043 A1 | 7/2020 | Park et al. |

OTHER PUBLICATIONS

Ishuang Wang, et al., Blue Quantum Dot Light-Emitting Diodes with High Electroluminescent Efficiency, 2017 American Chemical Society, Appl. Mater. Interfaces 2017, 9, 38755-38760.

* cited by examiner

SEMICONDUCTOR NANOCRYSTAL PARTICLE, METHOD FOR PREPARING SAME, AND DEVICE INCLUDING SAME

CROSS-REFERENCE TO RELATED APPLICATION

This divisional application claims priority to U.S. patent application Ser. No. 16/998,262 filed Aug. 20, 2020, now U.S. Pat. No. 11,563,143, which in turn claims priority Korean Patent Application No. 10-2019-0107637 filed in the Korean Intellectual Property Office on Aug. 30, 2019, and all the benefits accruing therefrom under 35 U.S.C. §§ 119, 120 the
contents of which in their entirety are incorporated herein by reference

BACKGROUND

1. Field

A quantum dot, a method for preparing a quantum dot, and a device including a quantum dot are disclosed.

2. Description of the Related Art

Unlike bulk materials, intrinsic physical characteristics (e.g., energy bandgaps, melting points, etc.) of nanoparticles may be varied or controlled by changing the size, of the nanoparticle. Semiconductor nanocrystals also known as quantum dots is a semiconductor material having a crystalline structure having a particle size of several nanometers. The semiconductor nanocrystals have such a small size that the surface area per unit volume of the nanocrystal exhibits quantum confinement effects, and thus may have different physicochemical characteristics based on the semiconductor material itself. For example, a quantum dot if placed in an excited energy state, e.g., with irradiation from a light source or with electrical energy, e.g., an applied electric current, may emit light in a wavelength corresponding to the size of the quantum dot. Accordingly, a quantum dot may absorb light from an excitation source and may emit light energy corresponding to its energy bandgap, that is, a quantum dot may exhibit electroluminescent and photoluminescent properties. In the quantum dot, the energy bandgap may be adjusted by controlling the sizes and/or the compositions of the semiconductor nanocrystal, which often can lead to photoluminescence or electroluminescent characteristics of high color purity. Therefore, quantum dots may have various applications such as in a display device, an energy device, a bio-light emitting device, or the like and are of interest.

A quantum dot having a core-shell structure is known to have slightly increased luminous efficiency due to surface passivation by a shell, however, may of the known quantum dots include cadmium, and cadmium is an element known to present serious environmental issues or concerns. Accordingly, of interest is the development of quantum dots that do not include cadmium, and yet still, exhibit excellent light emitting characteristics including high quantum efficiency.

SUMMARY

An embodiment provides an environmentally-friendly quantum dot capable of exhibiting improved light emitting characteristics, particularly improved blue light emitting characteristics.

Another embodiment provides the method for preparing a quantum dot.

Another embodiment provides an electronic device including the quantum dot.

A quantum dot according to an embodiment includes a quantum dot including a core including a first semiconductor nanocrystal including zinc and selenium, and optionally sulfur and/or tellurium, and a shell including a second semiconductor nanocrystal including zinc and at least one of sulfur or selenium, wherein the quantum dot has an average particle diameter of greater than or equal to about 13 nanometers (nm), an emission peak wavelength in a range of about 440 nm to about 470 nm, and a full width at half maximum (FWHM) of an emission wavelength of less than about 25 nm, wherein the quantum dot is cadmium-free.

The quantum dot may have an average particle diameter of about 13 nm to about 20 nm, and an emission peak wavelength in a range of about 445 nm to about 460 nm.

The quantum dot may exhibit quantum efficiency of greater than or equal to about 70%.

The first semiconductor nanocrystal may include zinc and selenium, or, or zinc, selenium, and tellurium.

The second semiconductor nanocrystal may include zinc and selenium, zinc and sulfur, or zinc, selenium, and sulfur.

A ratio of a total moles of sulfur and selenium relative to moles of zinc in the second semiconductor nanocrystal may be about 1 to about 2.

A method for preparing a quantum dot according to another embodiment includes
providing a core including a first semiconductor nanocrystal including zinc and selenium, and optionally sulfur and/or tellurium;
providing (i) a first solution including zinc-carboxylate, e.g., (Zn(carboxylate)$_2$), a fluorine ion source, and a solvent, or (ii) a second solution including ZnF$_2$ and a solvent;
adding the core to the first solution, or the second solution to provide a first core solution or a second core solution, respectively,
adding at least one of a sulfur precursor, or a selenium precursor, to the first core solution or the second core solution, and allowing the core solutions to react,
wherein the core-shell quantum dot has an average particle diameter of greater than or equal to about 13 nm, an emission peak wavelength in a range of about 440 nm to about 470 nm, and a full width at half maximum (FWHM) of an emission wavelength of less than about 25 nm.

The fluorine ion source included in the first solution may include ZnF$_2$, HF, NH$_4$F, LiF, NaF, KF, BeF$_2$, MgF$_2$, CaF$_2$, SrF$_2$, CuF, AgF, AuF, ZnF$_2$, HgF$_2$, AlF$_3$, GaF$_3$, InF$_3$, SnF$_2$, PbF$_2$, or a combination thereof.

The second solution may further include a zinc precursor in addition to the ZnF$_2$.

The zinc precursor of the second solution may include dimethyl zinc, diethyl zinc, zinc acetate, zinc acetylacetonate, zinc iodide, zinc bromide, zinc chloride, zinc carbonate, zinc cyanide, zinc nitrate, zinc oxide, zinc peroxide, zinc perchlorate, zinc sulfate, or a combination thereof.

The zinc-carboxylate included in the first solution may include zinc-oleate (Zn(Oleate)$_2$), zinc palmitate, zinc stearate, zinc octanoate, or a combination thereof.

The zinc precursor in addition to ZnF$_2$ included in the second solution may include zinc-oleate (Zn(oleate)$_2$), zinc palmitate, zinc stearate, zinc octanoate, or a combination thereof.

A content of the zinc-carboxylate included in the first solution, or a content of the ZnF$_2$ included in the second solution, may be less than or equal to about 20 mole percent zinc, based on a total moles of zinc in the quantum dot.

Following the addition of the core to the second solution, a zinc precursor may be optionally added to the second core solution, and react.

The core is added to the first solution or the second solution, and undergoes a first reaction, at least one of the sulfur precursor or the selenium precursor is then added to the first core solution or the second core solution and undergoes a second reaction.

The first solution or second solution may further include a ligand compound.

The ligand compound may include RCOOH, $RNH_2$, $R_2NH$, $R_3N$, RSH, $R_3PO$, $R_3P$, ROH, RCOOR', $RPO(OH)_2$, $R_2POOH$, or a combination thereof, wherein, R and R' are independently a C1 to C24 aliphatic hydrocarbon group, or a C5 to C20 aromatic hydrocarbon group.

The adding of at least one of the sulfur precursor or the selenium precursor to the first or the second core solution includes a reaction at a temperature of about 300° C. to about 350 C.

The electronic device according to another embodiment may include the quantum dot according to an embodiment, or the quantum dot prepared by the method according to an embodiment.

The quantum dot according to an embodiment is a cadmium-free environmentally-friendly quantum dot that maintains a relatively larger particle size and uniform shape, emits longer wavelength in the blue light region of the spectrum, has a relatively smaller full width at half maximum (FWHM), and a greater quantum efficiency. Thus, the quantum dot, or a plurality of quantum dots according to an embodiment, may be advantageously used for a production of blue light emitting devices having high luminance, high color reproducibility, and high reliability, and may also be used for various electronic devices such as various display devices including blue light emitting devices, biolabels (e.g., for biosensors, bioimaging), photodetectors, solar cells, hybrid composites, and the like.

DETAILED DESCRIPTION

Figure 1:
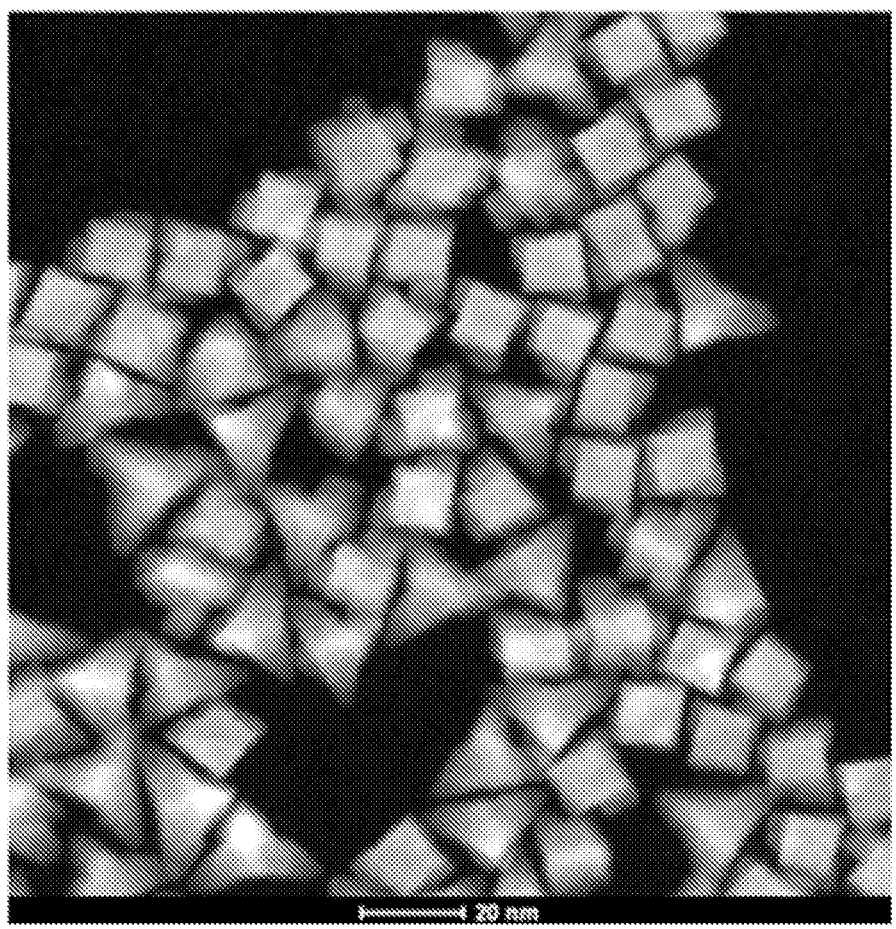
FIG. 1 shows a TEM image of the quantum dot according to Example 1.

Advantages and characteristics of this disclosure, and a method for achieving the same, will become evident referring to the following embodiments together with the drawings attached hereto. However, the embodiments should not be construed as being limited to the embodiments set forth herein.

If not defined otherwise, all terms (including technical and scientific terms) in the specification may be defined as commonly understood by one skilled in the art, and therefore, should be interpreted as having a meaning that is consistent with their meaning in the context of the relevant art and the present disclosure, and will not be interpreted in an idealized or overly formal sense unless expressly so defined herein.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

As used herein, the term "not including cadmium (or other harmful heavy metal)" refers to the case where a concentration of the cadmium (or the harmful heavy metal) may be less than or equal to about 100 ppm, less than or equal to about 50 ppm, less than or equal to about 10 ppm, or almost zero. In an embodiment, substantially no amount of the cadmium (or other heavy metal) may be present or, if present, an amount of the cadmium (or other heavy metal) may be less than or equal to a detection limit or as an impurity level of a given analysis tool (e.g., an inductively coupled plasma atomic emission spectroscopy).

As used herein, "metal" refers to a metal or a semi-metal.

As used herein, "alkyl" refers to a linear or branched saturated monovalent hydrocarbon group (e.g., methyl, hexyl etc.). Unless indicated otherwise, an "alkyl" may have any number of carbon atoms, e.g., from 1 to 60 carbon atoms, or 1 to 32 carbon atoms, or 1 to 24 carbon atoms, or 1 to 12 carbon atoms.

As used herein, "alkenyl" refers to a linear or branched monovalent hydrocarbon group having at least one carbon-carbon double bond.

As used herein, "aryl" refers to a monovalent group formed by removing one hydrogen atom from at least one aromatic ring (e.g., phenyl or naphthyl).

As used herein, "Group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, "metal" includes a semi-metal such as Si.

As used herein, "Group I" refers to Group IA and Group IB, and examples may include Li, Na, K, Rb, and Cs, but are not limited thereto.

As used herein, "quantum yield (QY)" is a value determined by the photoluminescence spectrum obtained by dispersing quantum dots in a toluene solvent, based on the emission peak of ethanol solution of an anthracene dye (absorption (optical density) at 450 nm: 0.1).

As nanocrystal particles including a semiconductor material, that is, quantum dots have photoluminescence characteristics with high color purity and are capable of controlling an energy bandgap depending upon a size and a composition, so they draw attentions as a material capable of applying to various fields, such as, for example, a display, energy, semiconductor, bio technologies, and the like.

Currently, quantum dots that demonstrate good performance in terms of light emitting characteristics and stability will likely include cadmium (Cd). For example, quantum dots including Cd in the core and/or shell may exhibit relatively high luminous efficiency. However, cadmium may cause severe environment/health problems and is a restricted element by Restriction of Hazardous Substances Directive (RoHS) in a plurality of countries. Therefore, it is desired to develop environmentally-friendly quantum dots which may emit light of a desired wavelength while having improved light emitting characteristics (for example, as applied to an electroluminescent device) and does not include cadmium.

Accordingly, research on cadmium-free semiconductor nanocrystals, that is, semiconductor nanocrystals prepared by using a Group III-V compound as the cadmium-free quantum dots, for example, quantum dots including a compound such as InP and the like in a core, quantum dots including a Group II-VI compound, for example, a compound such as ZnSe and the like in a core is of great interest. Among known cadmium-free quantum dots, many have found that blue light-emitting quantum dots as applied to a photoluminescence (PL) display, a electroluminescence (EL) display, or the like are unsatisfactory in terms of performance due to lower quantum efficiency, lower photostability, and lower reliability than those of green or red light emitting, cadmium-free quantum dots.

The present inventors have made an effort to prepare cadmium-free quantum dots that emit blue light, and exhibit improved quantum efficiency, and a lower full width at half maximum (FWHM) of an emission wavelength. The cadmium-free quantum dots described herein have a relatively larger particle diameter, and tend to be of uniform shape and size, and therefore, may be used in a light emitting device having high color reproducibility, high luminance, and high reliability.

A quantum dot according to an embodiment includes a quantum dot including a core including a first semiconductor nanocrystal including zinc and selenium, and optionally sulfur and/or tellurium, and a shell including a second semiconductor nanocrystal including zinc and at least one of sulfur or selenium, wherein the quantum dot has an average particle diameter of greater than or equal to about 13 nm, for example, about 13 nm to about 20 nm, an emission peak wavelength in a range of about 440 nm to about 470 nm, and a full width at half maximum (FWHM) of emission wavelength of less than about 25 nm, wherein the quantum dot is cadmium-free.

The quantum dot according to an embodiment is a cadmium-free quantum dot, that is, a cadmium-free quantum dot including no cadmium in a core and/or a shell, which has an emission peak wavelength in a range of about 440 nm to about 470 nm, and thus, emits blue light, and has a low full width at half maximum (FWHM) of less than about 25 nm, less than 20 nm, or less than 16 nm. The quantum dots tend to have a relatively larger particle diameter than that of other known blue light emitting quantum dots, and thus may be used to produce a blue light emitting device having high color reproducibility and high reliability. In addition, the quantum dot described herein has a quantum efficiency of greater than or equal to about 70%, for example, greater than or equal to about 75%, greater than or equal to about 80%, and thus may be used to achieve a light emitting device having high luminance.

A shape of the quantum dot is not particularly limited. For example, the quantum dot may have a spherical shape, a pyramid shape, a multi-armed (or multi-pod) or cubic shape, but is not limited thereto. The quantum dot according to an embodiment, as shown in examples described later, primarily have a cubic shape, and in some instances a pyramidal shape, but is not limited to these two shapes. Rather, these two shapes tend to be predominantly present in some embodiments. Moreover, a quantum dot according to an embodiment will tend to exhibit a shape and a size with greater uniformity.

The first semiconductor nanocrystal included in the core of the quantum dot may include zinc and selenium, or zinc, selenium, and tellurium, or zinc, selenium, and sulfur. For example, the first semiconductor nanocrystal may include zinc, selenium, and tellurium.

The second semiconductor nanocrystal included in the shell of the quantum dot may include zinc and selenium, zinc and sulfur, or zinc, selenium, and sulfur. For example, the second semiconductor nanocrystal may include zinc, selenium, and sulfur. Moreover, in an embodiment, a ratio of a total moles of sulfur and selenium relative to a moles of zinc in the second semiconductor nanocrystal of the quantum dot may be about 1 to about 2, for example, about 1 to about 1.5.

When the quantum dot has a ratio of a total moles of sulfur and selenium relative to moles of zinc in the second semiconductor nanocrystal within the range, a difference in the energies of bandgap between core and shell of the quantum dot increases, and accordingly, the quantum dot may exhibit excellent light emitting characteristics of high quantum efficiency and a narrow full width at half maximum (FWHM).

As described above, the quantum dot according to an embodiment has a core/shell structure including a core including the first semiconductor nanocrystal, and a shell including the second semiconductor nanocrystal disposed on the surface of the core, for example, at least a portion of the surface or the whole surface of the core. The shell may be a multi-layered shell including at least two layers, wherein each layer, for example, neighboring layers of this multi-layered shell may have the same or different compositions.

Without being bound by any particular theory, the shell of the quantum dot may play a role of effectively passivating the surface of the core, and thereby, increase luminous efficiency of the quantum dot and the operational stability of the quantum dot. In addition, the shell may play a role of a physical barrier to secure stability of the core, which can be structurally or chemically sensitive depending on the surrounding environment. Accordingly, in an attempt to increase luminous efficiency of the quantum dot as well as its operation stability, the quantum dot is prepared in a manner so that the shell may have a predetermined thickness of the core/shell structure.

In general, however, as the shell of a core/shell quantum dot increases in size, the shape of the quantum dot trends to non-uniformity, or a full width at half maximum (FWHM) of an emission wavelength tends to increase. As a result, the quantum dot may not achieve or exhibit high color reproducibility in a light emitting device. Although a quantum dot having a predetermined size or relatively larger particle size may provide an opportunity for blue light emission, particularly in the deep blue, i.e., 440 nm to 470 nm, 445 nm to 465 nm, 445 nm to 460 nm, 448 nm to 460 nm, 449 nm to 460 nm, 450 nm to 460 nm, or 450 nm to 455 nm, a technical problem in achieving such a blue light emitting quantum dot can lie in controlling the shape or uniformity of the quantum dot, which is a difficult technical task with no easy solution. Accordingly, a blue light emitting quantum dot that emits blue light, has a high luminous efficiency, a narrow full width at half maximum (FWHM), and has a large particle size, and a relative uniform particle shape is difficult to prepare.

Conventionally, chlorine is included in a shell during the preparation of a quantum dot having a core/shell structure to increase luminous efficiency, achieve blue light emission, and increase shell thickness, however, the drawback to the presence of chlorine will likely result in a distortion (or non-uniform) in the shape of the particle and an increase in the full width at half maximum (FWHM) of an emission spectrum.

The quantum dot according to an embodiment, which emits blue light in the region 440 nm to 470 nm, 445 nm to 465 nm, 445 nm to 460 nm, 448 nm to 460 nm, 449 nm to 460 nm, 450 nm to 460 nm, or 450 nm to 455 nm, and has high luminous efficiency and simultaneously, a narrow full width at half maximum (FWHM) of an emission spectrum may be prepared by a method including adding a core including the first semiconductor nanocrystal to a solvent including a zinc-carboxylate ($Zn(carboxylate)_2$) and a fluorine ion source, or a zinc fluoride ($ZnF_2$) and solvent, adding precursors of the second semiconductor nanocrystal thereby forming the shell around the core (or the first semiconductor nanocrystal). The quantum dot that results from such a process has a relatively large particle size with a uniform particle shape.

A method for preparing a core-shell quantum dot according to embodiment includes providing a core including a first semiconductor nanocrystal including zinc and selenium, and optionally sulfur and/or tellurium, preparing (i) a first solution including zinc-carboxylate ($Zn(carboxylate)_2$), a fluorine ion source, and a solvent, or (ii) a second solution including $ZnF_2$ and a solvent, adding the core to the first solution or the second solution to provide a first core solution or a second core solution, respectively; and adding at least one of a sulfur precursor or a selenium precursor to the first core solution or the second core solution, and allowing the core solutions to react.

As noted above, the technology of increasing the shell thickness by including chlorine in the shell may increase luminous efficiency as disclosed (Korean Patent Laid-Open Publication No. 2017-0074858A1 published in Dec. 22, 2015.). The Laid-Open patent discloses the effects accomplished by introducing a halogen element such as chlorine to the shell and in the working Examples, demonstrates a luminous efficiency difference depending on whether or not chlorine is present, however, there does not appear to be a discussion regarding the formation of a first core solution or a second core solution as described above, and then adding precursors to form a core/shell quantum dot.

In addition, the Laid-Open patent specifically discloses Examples of the core including an InP compound, but not necessarily a first semiconductor nanocrystal including zinc and selenium, and optionally, sulfur and/or tellurium. Furthermore, full widths at half maximum (FWHM) of emission spectra of the quantum dots of the Laid-Open patent are about 40 nm, which is much larger than about 25 nm or 20 nm, and have a significantly greater than a full width at half maximum (FWHM) of an emission spectrum than the quantum dot according to an embodiment.

Accordingly, the method of preparing a quantum dot having a core/shell structure includes adding the core including the first semiconductor nanocrystal including zinc and selenium, and optionally, sulfur and/or tellurium to (i) a first solution including the zinc-carboxylate (Zn $(carboxylate)_2$), a fluorine ion source, and a solvent, or (ii) a second solution including the $ZnF_2$ and a solvent, and then adding the precursors of a second semiconductor nanocrystal to form a shell around the core. A quantum dot prepared by the method according to an embodiment are different from the quantum dot prepared by a method including adding chlorine or halogen to a shell and a corresponding method for preparing the quantum dot.

Without wishing to be bound by a specific theory, in the method of preparing the quantum dot according to an embodiment, when the zinc fluoride ($ZnF_2$) is used for the second solution, or a zinc-carboxylate and a fluorine ion source are used for the first solution, as precursors of the zinc fluoride ($ZnF_2$), to form the shell around the core, the zinc of the zinc fluoride ($ZnF_2$) is believed to play a role as a precursor of zinc of the second semiconductor nanocrystal and to form the shell with other precursors of the second semiconductor nanocrystal to increase a thickness of the shell. Moreover, the fluorine ion may play a role in controlling the shell growth to provide uniform growth of the shell. Accordingly, according to the method of preparing the quantum dot that includes adding the core to the second solution including the zinc fluoride or the first solution including zinc-carboxylate, which is a precursor of the zinc fluoride in the presence of a fluorine ion source, and then, adding the precursor of the second semiconductor nanocrystal shell to provide a second or first core solution, respectively, the quantum dot may have an increased size of greater than or equal to about 13 nm. The result of which is a quantum dot that can emit blue light, e.g., with a wavelength of about 440 nm to 470 nm, and improved luminous efficiency. Moreover, the quantum dot particle can maintain a uniform size and shape, and a full width at half maximum (FWHM) of an emission wavelength of less than about 25 nanometers.

However, as aforementioned, the prior art including halide in a shell by adding metal halide (e.g., $ZnCl_2$, etc.) exhibits an effect of increasing a shell thickness and thus luminous efficiency, but, as the shell increases in thickness, the chloride appears to play little or no role in controlling the uniformity of the quantum dot particle size or shape. The Laid-Open patent introduces the metal halide as a second halogen source and discloses Example of introducing a fluorine ion source such as HF (hydrogen fluoride) and the like as a first halogen source, but fails to disclose a solution including the fluorine ion source along with zinc-carboxylate, for example, zinc-oleate and the like. Moreover, the Laid-Open patent appears not to provide a method of adding the core to the solution to prepare the semiconductor nanocrystal having a core-shell structure, as according to the embodiments described herein.

In an embodiment, a content of the zinc-carboxylate ($Zn(carboxylate)_2$) included in the first solution, or a content of the zinc-fluoride ($ZnF_2$) included in the second solution may account for less than or equal to about 20 mole percent (mol %), for example, about 1 mol % to about 20 mol %, about 5 mol % to about 20 mol %, about 5 mol % to about 15 mol %, or about 10 mol %, based on total moles of zinc included in the core and shell of the quantum dot, but are not limited thereto.

The fluorine ion source included in the first solution may include a salt compound of a metal or a non-metal and a fluorine ion, for example, $ZnF_2$, HF, $NH_4F$, LiF, NaF, KF, $BeF_2$, $MgF_2$, $CaF_2$, $SrF_2$, CuF, AgF, AuF, $HgF_2$, $AlF_3$, $GaF_3$, $InF_3$, $SnF_2$, $PbF_2$, or a combination thereof, but is not limited thereto. In an embodiment, the fluorine ion source included in the first solution may include ZnF2, HF, or a combination thereof.

For example, the zinc-carboxylate included in the first solution may include zinc-oleate ($Zn(oleate)_2$), zinc palmitate, zinc stearate, or zinc octanoate. The zinc-carboxylate may also be used as a zinc precursor to form a second semiconductor nanocrystal included in the shell. However, this zinc-carboxylate is not included alone, and as described above, it may be used with the fluorine ion source to prepare the quantum dot according to an embodiment.

Meanwhile, the second solution may include $ZnF_2$ alone or may include another zinc precursor in addition to the $ZnF_2$. Any zinc precursor can be used in addition to $ZnF_2$, as a precursor of zinc to form the second semiconductor nanocrystal, and is not limited to a specific compound. For example, the zinc precursor may include dimethyl zinc, diethyl zinc, zinc acetate, zinc acetylacetonate, zinc iodide, zinc bromide, zinc chloride, zinc carbonate, zinc cyanide, zinc nitrate, zinc oxide, zinc peroxide, zinc perchlorate, zinc sulfate, or a combination thereof, but is not limited thereto.

The first solution or second solution may be heated to a desired temperature. The heating of the first solution as desired may include heating the first solution at a temperature of greater than or equal to about 40° C., for example, greater than or equal to about 50° C., greater than or equal to about 60° C., greater than or equal to about 70° C., greater than or equal to about 80° C., greater than or equal to about 90° C., greater than or equal to about 100° C., or greater than or equal to about 110° C. under a vacuum or inert gas atmosphere. In addition, it may include heating the first solution at a temperature of greater than or equal to about 100° C., for example, greater than or equal to about 150° C., or greater than or equal to about 170° C. under a nitrogen atmosphere.

In an embodiment, after adding the core including the first semiconductor nanocrystal to the first solution or the second solution to provide a first core solution or a second core solution, respectively, and before adding the shell-forming precursors including the second semiconductor nanocrystal to the first or second core solutions, the first core solution or the second core solution may be heated to a desired reaction temperature. At least one precursor of the sulfur precursor or selenium precursor is then added to the heated core solutions, and a reaction between the core and the shell-forming precursors results, thereby forming the shell around the core, which includes the first semiconductor nanocrystal. The reaction temperature is not particularly limited and may be appropriately selected in consideration of the types of the precursors used, the zinc-carboxylate, the fluorine ion source, zinc-fluoride, and the solvent used, and the like. For example, the reaction temperature may be greater than or equal to about 200° C., for example, greater than or equal to about 220° C., greater than or equal to about 250° C., greater than or equal to about 270° C., greater than or equal to about 280° C., greater than or equal to about 290° C., greater than or equal to about 300° C., greater than or equal to about 310° C., greater than or equal to about 320° C., greater than or equal to about 340° C., or greater than or equal to about or 350° C. For example, the reaction temperature may be less than or equal to about 360° C., for example, less than or equal to about 50° C., less than or equal to about 340° C., less than or equal to about 330° C., or less than or equal to about 320° C. In an embodiment, the reaction temperature may be in a range of about 300° C. to about 350° C.

As described above, when the second solution includes $ZnF_2$ alone but no zinc precursor, a reaction temperature forming a shell on the surface of a semiconductor nanocrystal core may be higher than that of a solution that includes a zinc precursor. For example, when the core is added to the first solution or the second solution, a reaction of forming a shell by adding at least one of the sulfur precursor or the selenium precursor may be performed at about 300° C. to about 350° C. Herein, when the second solution further includes additional zinc precursors, for example, zinc-oleate, $ZnCl_2$, or a combination thereof along with $ZnF_2$, the reaction temperature for forming the shell may be within a range of about 300° C. to about 340° C., for example, about 320° C. to about 340° C. In another embodiment, when the second solution includes $ZnF_2$ alone, i.e., without additional zinc precursors, the reaction temperature for forming the shell may be about 340° C. to about 350° C., for example, about 350° C.

The reaction time is not particularly limited, but appropriately selected. For example, the reaction may be permitted to take place for greater than or equal to about 5 minutes, greater than or equal to about 10 minutes, or greater than or equal to about 15 minutes but is not limited thereto. When the precursor mixture is injected by stages, a predetermined time in each step may be, for example, greater than or equal to about 5 minutes, greater than or equal to about 10 minutes, or greater than or equal to about 15 minutes. The reaction may be performed under an inert gas atmosphere or in the air or under vacuum, but is not limited thereto.

The method for preparing a quantum dot according to an embodiment may be similar to a general method of preparing a quantum dot except that after preparing the first solution or the second solution, a core is added to provide a first core solution or a second core solution, respectively. Subsequently at least one of additional precursors, that is, a sulfur precursor or a selenium precursor for forming the shell is added to the core solutions. For example, after adding the core including the first semiconductor nanocrystal to the first solution or the second solution, the addition of the precursor of the second semiconductor nanocrystal forming the shell may be performed by dividing an entire amount of the precursors of the added second semiconductor nanocrystal into two or more portions and adding portion by portion at predetermined time intervals. Alternatively, when two or more precursors of the second semiconductor nanocrystal are present, each of the two or more precursors may be divided into predetermined portions, and alternatively added at select time intervals. This addition may be appropriately adjusted by a person having an ordinary skill in the related art in order to appropriately adjust desired characteristics in each quantum dot. Accordingly, in an embodiment, after adding the core to the first solution or the second solution, at least one of the sulfur precursor or the selenium precursor may be added to the core solutions at once or divided into several portions and added over several time intervals.

At least one of the sulfur precursor or the selenium precursor may include one or two or more types of precursors, respectively. When at least one of the sulfur precursor or selenium precursor includes two or more types of the first precursor and the second precursor, each precursor may be added simultaneously or at a predetermined time intervals. Each precursor may be added to the reaction solution at the same or different temperature. The first precursor is mixed with the same/different types of ligand and/or solvent in consideration of a shell composition of a final quantum dot, and thus, used as a first mixture, and the second precursor may be mixed with the same/different types of ligand and/or solvent in consideration of the shell composition of the final quantum dot, and then, additionally added to the first mixture at least once, for example, twice, three times, four times, five times, or more times.

The type of the sulfur-containing precursor is not particularly limited. The sulfur-containing precursor may include a sulfur powder, hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bis(trimethylsilyl) sulfide, ammonium sulfide, sodium sulfide, or a combination thereof.

The type of the selenium-containing precursor is not particularly limited. For example, the selenium-containing precursor may include selenium, selenium-trioctylphosphine (Se-TOP), selenium-tributylphosphine (Se-TBP), selenium-triphenylphosphine (Se-TPP), or a combination thereof, but is not limited thereto.

The solvent may be selected from C6 to C22 primary amine such as hexadecylamine; C6 to C22 secondary amine such as dioctylamine; C6 to C40 tertiary amine such as trioctylamine; a nitrogen-containing heterocyclic compound such as pyridine; C6 to C40 aliphatic hydrocarbon (e.g., alkane, alkene, alkyne, etc.) such as hexadecane, octadecane, octadecene, or squalane; C6 to C30 aromatic hydrocarbon such as phenyldodecane, phenyltetradecane, or phenyl hexadecane; phosphine substituted with a C6 to C22 alkyl group such as trioctylphosphine; phosphine oxide substituted with a C6 to C22 alkyl group such as trioctylphosphine oxide; C12 to C22 aromatic ether such as phenyl ether or benzyl ether, or a combination thereof. The type of solvent may be appropriately selected in consideration of the types of precursors, zinc-carboxylate, fluorine ion source, and organic ligand.

The quantum dot according to an embodiment may include organic ligands coordinated on its surface. The organic ligand may use generally known ligand compounds but is not particularly limited. For example, the ligand compound may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $R_2POOH$ (wherein, R and R' are independently a C1 to C24 alkyl group, a C2 to C24 alkenyl group, a C2 to C24 alkynyl group, or a C6 to C20 aryl group), or a combination thereof. The organic ligand compound may coordinate the surface of the obtained nanocrystal, may help the nanocrystal be well dispersed in the solution, and may also have an effect on light emitting and electrical characteristics of the quantum dot. Specific examples of the organic ligand compound may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, substituted or unsubstituted octylphosphine (e.g., trioctylphosphine (TOP)), and the like; phosphine oxide such as substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphine oxide, etc.), substituted or unsubstituted propyl phosphine oxide, substituted or unsubstituted butyl phosphine oxide, substituted or unsubstituted octylphosphine (e.g., trioctylphosphine oxide (TOPO)), and the like; a diphenyl phosphine or triphenyl phosphine compound, or an oxide compound thereof; phosphonic acid, and the like, but are not limited thereto. The organic ligand compound may be used alone or as a mixture of two or more.

In order to make a quantum dot that includes an organic ligand on a surface thereof according to an embodiment, the first solution or the second solution may further include a ligand compound. This ligand compound may be at least one of various ligand compounds exemplified above, but is not limited thereto.

In the first solution, each amount of the zinc-carboxylate ($Zn(carboxylate)_2$), the fluorine ion source, and the solvent may be, for example, appropriately selected in consideration of a desired shell thickness, types of precursors, and the like but is not particularly limited thereto. In the second solution, each amount of $ZnF_2$ and the solvent, and also the zinc precursor, if is additionally included, may be appropriately selected in consideration of a shell thickness, types of precursors, and the like as desired, but is not particularly limited thereto.

On the surface of the core including the first semiconductor nanocrystal, for example, a portion or all of the surface, it is possible to prepare a shell including the second semiconductor nanocrystal, and thus to provide a quantum dot having a core/shell structure through the reactions among the zinc-carboxylate, zinc-fluoride, sulfur precursor, selenium precursor, or a combination thereof.

The method for preparing the quantum dot may further include adding a nonsolvent to the reaction product between the core and the shell-forming precursors to separate the nanocrystal. The nonsolvent may be a polar solvent that is miscible with the solvent used in the reaction but cannot disperse the nanocrystals therein. The nonsolvent may be selected depending the solvent used in the reaction and may be for example, acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing solvents, or a combination thereof.

The separation of the prepared quantum dot may be performed through a centrifugation, precipitation, chromatography, or distillation. The separated nanocrystal may be added to a washing solvent and washed, if necessary. The separated nanocrystal may be a nanocrystal on which ligand compounds are coordinated. The washing solvent has no particular limit and may have a similar solubility parameter to that of the ligand, and may, for example, include hexane, heptane, octane, chloroform, toluene, benzene, and the like.

In another embodiment, a quantum dot polymer composite includes a polymer matrix; and the quantum dot is dispersed in the polymer matrix.

The polymer matrix may be a thiol-ene polymer, a (meth)acrylate-based polymer, a urethane-based resin, an epoxy-based polymer, a vinyl-based polymer, a silicone resin, or a combination thereof. The thiol-ene polymer may be one disclosed in US-2012-0001217-A1, the content of which is incorporated herein by reference in its entirety. The (meth)acrylate-based polymer, the urethane-based resin, the epoxy-based polymer, the vinyl-based polymer, and the silicone resin may be synthesized by known methods, or monomers or polymers thereof may be commercially available.

A content of the quantum dot in the polymer matrix may be appropriately selected and is not particularly limited. For example, the content of the quantum dot in the polymer matrix may be greater than or equal to about 0.1 weight percent (wt %) and less than or equal to about 30 wt % based on a total weight of the composite, but is not limited.

A method of preparing the quantum dot polymer composite may include the mixing of a dispersion component including the quantum dot with a solution including a polymer, and then removing a solvent therefrom, but is not limited thereto. Alternatively, the quantum dot polymer composite may be obtained by dispersing the quantum dot in a monomer mixture for forming the polymer, and polymerizing the mixture to form the composite. Such a quantum dot-polymer composite may be a quantum dot sheet (QD sheet).

Figure 3:
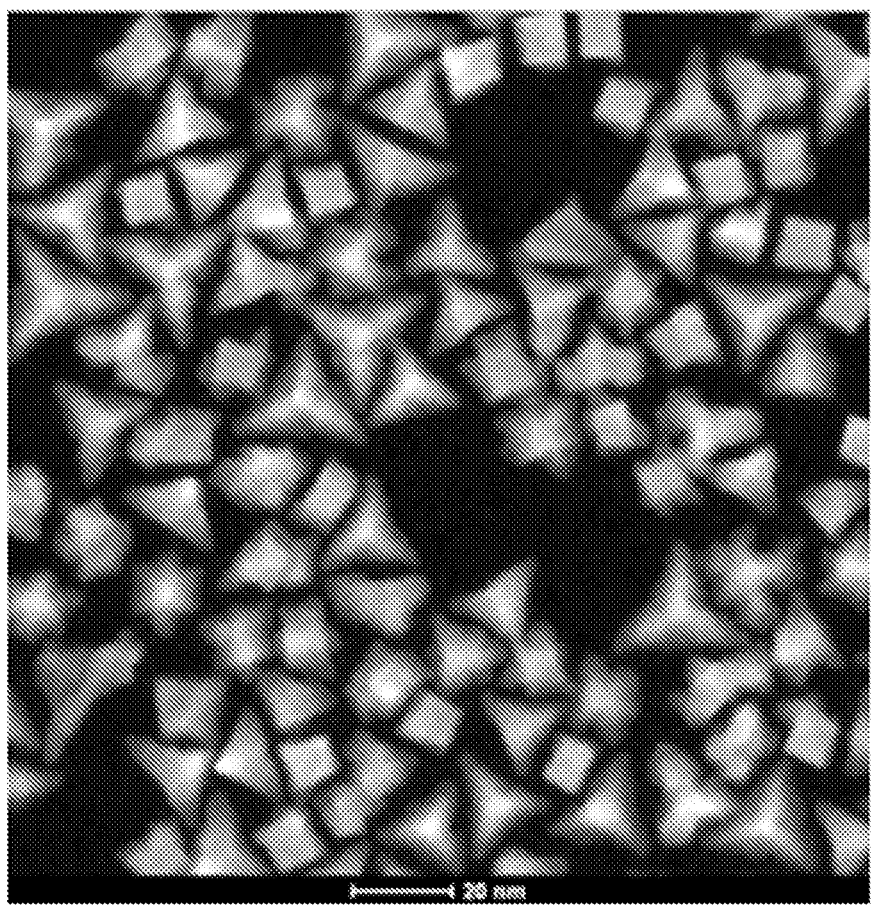
FIG. 3 shows a TEM image of the quantum dot according to Example 3.

Another embodiment provides an electronic device including the aforementioned quantum dot. Details of the semiconductor nanocrystal particle are the same as described above. The device may be a light emitting diode (LED), an organic light emitting diode (OLED), various displays (e.g., liquid crystal display (LCD)), a sensor, a solar cell, or an imaging sensor, but is not limited thereto. FIG. 3 shows a simplified stacking structure of a liquid crystal display (LCD) including the quantum dot sheet among these devices. The general structure of the liquid crystal display (LCD) is well known, and FIG. 3 shows the simplified structure.

Figure 13:
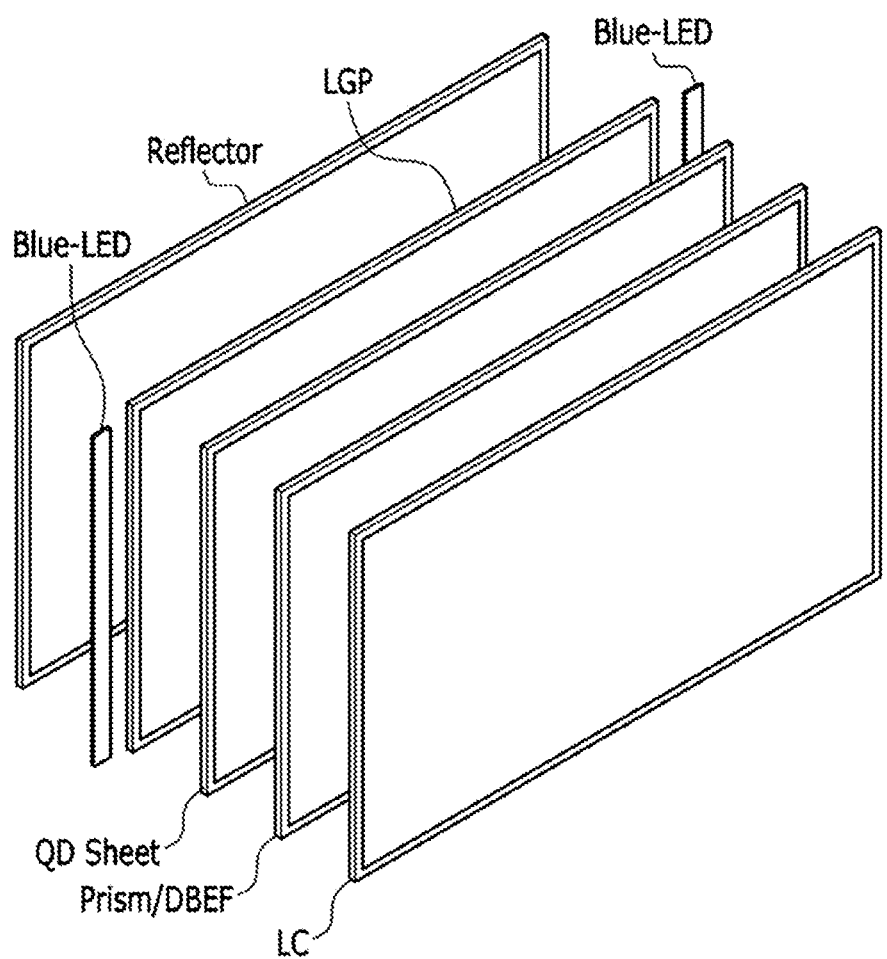
FIG. 13 is an exploded view of an electronic device (LCD) including a quantum dot according to an embodiment.

Referring to FIG. 13, the liquid crystal display may have a structure that includes a reflector, a light guide (LGP) and a blue LED light source (Blue-LED), a quantum dot-polymer composite sheet (QD sheet), various optical films (e.g., a prism, and a double brightness enhance film (DBEF) are stacked, and a liquid crystal panel is disposed thereon.

Hereinafter, the embodiments are illustrated in more detail with reference to examples. However, they are exemplary embodiments of the present invention, and the present invention is not limited thereto.

EXAMPLES

Analysis Methods

[1] Photoluminescence Analysis

Photoluminescence (PL) spectra of the prepared nanocrystals are obtained using a Hitachi F-7000 spectrometer at an irradiation wavelength of 372 nm.

[2] UV Spectroscopy

A Hitachi U-3310 spectrometer is used to perform a UV spectroscopy and obtain UV-Visible absorption spectra.

[3] TEM Analysis (1) Transmission electron microscope photographs of the prepared nanocrystals are obtained using an UT F30 Tecnai electron microscope.

(2) TEM-EDX analysis (element mapping) is performed using UT F30 Tecnai electron microscope.

[4] ICP Analysis

An inductively coupled plasma atomic emission spectroscopy (ICP-AES) is performed using Shimadzu ICPS-8100.

[5] HRTEM Analysis

HRTEM analysis is performed using TEM-Titan G2.

[6] X ray Diffraction Analysis

Crystal structures of the semiconductor nanocrystals are confirmed by performing XRD analysis using a Philips XPert PRO apparatus at a power of 3 kW.

Syntheses are performed under an inert gas atmosphere (under a nitrogen flowing condition), unless particularly stated otherwise.

Synthesis Example 1: Preparation I of ZnTeSe Core

Selenium and tellurium are dispersed in trioctylphosphine (TOP) to obtain a 2 M Se/TOP stock solution and a 0.1 M Te/TOP stock solution, respectively.

0.125 millimoles (mmole) of zinc acetate, 0.25 mmole of palmitic acid, and 0.25 mmole of hexadecylamine are added to a reactor containing 10 mL of trioctylamine, and the reaction mixture is heated to 120° C. under vacuum. After one hour, the atmosphere in the reactor is filled with nitrogen to provide an inert atmosphere.

After heating the reactor at 300° C., the Se/TOP stock solution and the Te/TOP stock solution are rapidly injected into the reactor in a Te/Se mole ratio of 1/25. After 10 minutes, 30 minutes, or 60 minutes, the reaction solution is rapidly cooled down to room temperature, acetone is added to the reaction mixture, and the obtained mixture is centrifuged to obtain a precipitate, and the precipitate is dispersed in toluene.

The obtained (first) semiconductor nanocrystal has a first absorption maximum wavelength ranging from 400 nm to 430 nm and a maximum peak emission wavelength ranging from 430 nm to 460 nm. The semiconductor nanocrystal has quantum efficiency ranging from about 30% to 40%.

Synthesis Examples 2-1 to 2-5: Preparation II of ZnTeSe Core

A core is prepared according to the same method as Synthesis Example 1 (reaction time: 30 to 60 minutes) except that the mole ratio between selenium and tellurium is adjusted as shown in Table 1.

Each maximum emission peak wavelength and full width at half maximum (FWHM) of the prepared cores, and a tellurium weight ratio in the prepared (first) semiconductor nanocrystals (examined by ICP) are shown in Table 1.

TABLE 1

| | Te/Se mole ratio of reaction system | Maximum emission peak wavelength (nm) | FWHM (nm) | Te content (wt %) |
|---|---|---|---|---|
| Syn. Example 2-1 | 0 | 422 | 24 | 0 |
| Syn. Example 2-2 | 1/50 | 431 | 48 | 1.78 |
| Syn. Example 2-3 | 1/30 | 441 | 57 | 2.82 |
| Syn. Example 2-4 | 1/25 | 445 | 57 | 3.34 |
| Syn. Example 2-5 | 1/8 | 478 | 67 | 7.5 |

Example 1: Preparation of ZnTeSe Core/ZnSe/ZnS Shell Quantum Dot

At room temperature, 0.5 mole of ZnF2 is added to 100 mL of squalane in a flask, 0.6 mole of zinc acetate and 0.09 mole of $ZnCl_2$ as a zinc precursor are also added to the flask, and the mixture is vacuum-treated at 120° C. for 10 minutes. The inside of the flask is filled with nitrogen ($N_2$) and is heated to 180° C. Subsequently, the ZnTeSe core prepared in Synthesis Example 1 (reaction time: 60 minutes) is added to the flask within 10 seconds, 0.75 mmole of zinc acetate is subsequently slowly added thereto, and the reaction temperature is raised to 340° C. and reacted for 10 minutes. Then, 0.75 mmole of zinc acetate and 0.5 mmole of Se/TOP are slowly injected into the flask, and then reacted for 10 minutes. Subsequently, 0.75 mmole of zinc acetate, 0.5 mmole of Se/TOP, and 1.0 mmole of S-TOP are added, and reacted for 10 minutes. 0.8 mmole of zinc acetate, 0.5 mmole of Se/TOP, and 1.5 mmole of S/TOP are added, and reacted for 10 minutes. Lastly, a mixed solution of 0.8 mmole of zinc acetate, 0.5 mmole of Se/TOP, and 1.24 mmole of S/TOP is slowly added, and reacted for 20 minutes.

After the reaction is completed, the reactor is cooled, and the prepared nanocrystals are centrifuged with ethanol and dispersed in toluene.

UV-Vis spectroscopy, a photoluminescence analysis, and a transmission electron microscopic analysis of the prepared nanocrystals (core/shell quantum dots) are performed, and the results are shown in FIG. 1 and Table 2.

Referring to the photoluminescence analysis result, the quantum dots exhibit a maximum emission peak of 452 nm (a full width at half maximum (FWHM): 16 nm) and quantum efficiency of 85%. In other words, the quantum dots emit blue light and exhibit excellent light emitting characteristics of a narrow full width at half maximum (FWHM) and high quantum efficiency.

In addition, referring to FIG. 1, the quantum dots tend to have primarily a cubic shape with some quantum dots having a pyramidal shape. The quantum dots have a particle diameter within a range of about 15.9 nm±1.2 nm (8%).

Inductively coupled plasma atomic emission spectroscopy of the ZnTeSe core and the ZnTeSe (core)/ZnSeS/ZnS (shell) is performed, and the results are listed as a mole ratio relative to Zn in Table 2.

Example 2: Preparation of ZnTeSe Core/ZnSe/ZnS Shell Quantum Dot

A quantum dot of ZnTeSe (core)/ZnSeS/ZnS (shell) is prepared according to the same method as Example 1 except that $ZnCl_2$ is not added to the reaction solution.

Figure 2:
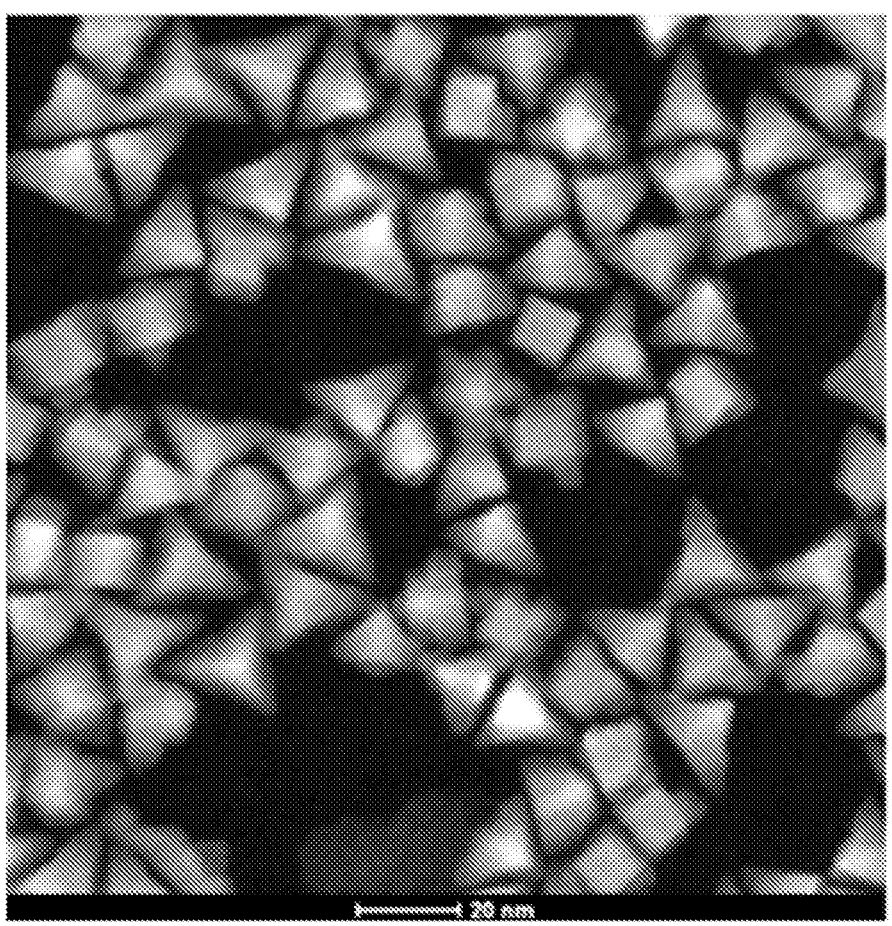
FIG. 2 shows a TEM image of the quantum dot according to Example 2.

UV-Vis spectroscopy, a photoluminescence analysis, and a transmission electron microscopic analysis of the prepared nanocrystals (core/shell) are performed, and the results are shown in FIG. 2 and Table 2.

Referring to the photoluminescence analysis result, the quantum dots exhibit a maximum emission peak of 451 nm (a full width at half maximum (FWHM): 15 nm) and quantum efficiency of 70%. In other words, the quantum dots emit blue light and exhibit excellent light emitting characteristics of high quantum efficiency and a narrow full width at half maximum (FWHM).

In addition, referring to the TEM image of FIG. 2, about half of the semiconductor nanocrystal particles has a pyramidal shape, and the other half a cubic shape. In addition, the quantum dots may have a particle diameter ranging from about 14.2 nm±1.1 nm (8%).

Inductively coupled plasma atomic emission spectroscopy of the ZnTeSe core and the ZnTeSe (core)/ZnSeS/ZnS (shell) is performed, and the results are listed as a mole ratio relative to Zn in Table 2.

TABLE 2

| | core | PL (@372) | A. QY | Zn (H Co., Ltd.) | Se | S | (Se + S)/Zn | S/Se |
|---|---|---|---|---|---|---|---|---|
| Ex. 1 | Syn. Ex. 1 | 452 | 16 | 85 | 4.45 | 2.0 | 3.74 | 1.29 | 1.87 |
| Ex. 2 | | 451 | 15 | 70 | 4.45 | 2.0 | 3.74 | 1.29 | 1.87 |

Example 3: Preparation of ZnTeSe Core/ZnSe/ZnS Shell Quantum Dot 1.8 mmole of zinc oleate, 0.5 mole of $ZnF_2$, and 0.09 mole of $ZnCl_2$ are added to 100 mL of squalane in a flask at room temperature, and then, vacuum-treated at 120° C. for 10 minutes. The inside of the flask is filled with nitrogen ($N_2$), and the reaction temperature is raised to 180° C. Subsequently, the ZnTeSe core prepared in Synthesis Example 1 (reaction time: 60 minutes) is added to the flask within 10 seconds, 0.5 mmole of Se/TOP is subsequently slowly added to the flask, and the reaction temperature raised to 280° C. Then, 0.7 mmole of S/TOP is added, and the reaction temperature raised to 320° C. and reacted for 10 minutes. Subsequently, a mixed solution of 0.5 mmole of Se/TOP and 0.9 mmole of S/TOP is slowly added, and reacted for 20 minutes. Lastly, a mixed solution of 0.5 mmole of Se/TOP and 1.2 mmole of S/TOP is slowly added, and reacted for 20 minutes.

After the reaction is completed, the reactor is cooled, and the prepared nanocrystals are centrifuged with ethanol and dispersed in toluene.

UV-Vis spectroscopy, a photoluminescence analysis, and a transmission electron microscopic analysis of the prepared nanocrystals (core/shell) are performed, and the results are shown in FIG. 3 and Table 3.

Referring to the photoluminescence analysis result, the quantum dots exhibit a maximum emission peak of 451 nm (a full width at half maximum (FWHM) of 21 nm) and quantum efficiency of 82%. In other words, the quantum dots emit blue light and exhibit excellent light emitting characteristics of high quantum efficiency and a narrow full width at half maximum (FWHM).

In addition, referring to the TEM image of FIG. 3, the prepared quantum dots have a multi-pod shape. In addition, the quantum dots have a particle diameter of about 13 nm±1.2 nm (9%).

Inductively coupled plasma atomic emission spectroscopy of the ZnTeSe core and the ZnTeSe (core)/ZnSeS/ZnS (shell) is performed, and the results listed as aa mole ratio relative to Zn are shown in Table 3.

Example 4: Preparation of ZnTeSe Core/ZnSe/ZnS Shell Quantum Dot 0.5 mole of $ZnF_2$ and 0.09 mole of $ZnCl_2$ are added to 100 mL of squalane in a flask at room temperature, and vacuum-treated at 120° C. for 10 minutes. The inside of the flask is filled with nitrogen ($N_2$), and the reaction temperature is raised to 180° C. Subsequently, the ZnTeSe core prepared in Synthesis Example 1 (reaction time: 60 minutes) is added to the flask within 10 seconds, 0.5 mmole of Se/TOP is subsequently slowly added to the flask, and the reaction temperature is raised to 280° C. Then, 0.7 mmole of S/TOP is added, and the reaction temperature is raised to 340° C. and reacted for 10 minutes. Subsequently, a mixed solution of 0.5 mmole of Se/TOP and 0.9 mmole of S/TOP is slowly added, and reacted for 20 minutes. Lastly, a mixed solution of 0.5 mmole of Se/TOP and 1.2 mmole of S/TOP is slowly added and reacted for 20 minutes.

After the reaction is completed, the reactor is cooled, and the prepared nanocrystals are centrifuged with ethanol and dispersed in toluene.

Figure 4:
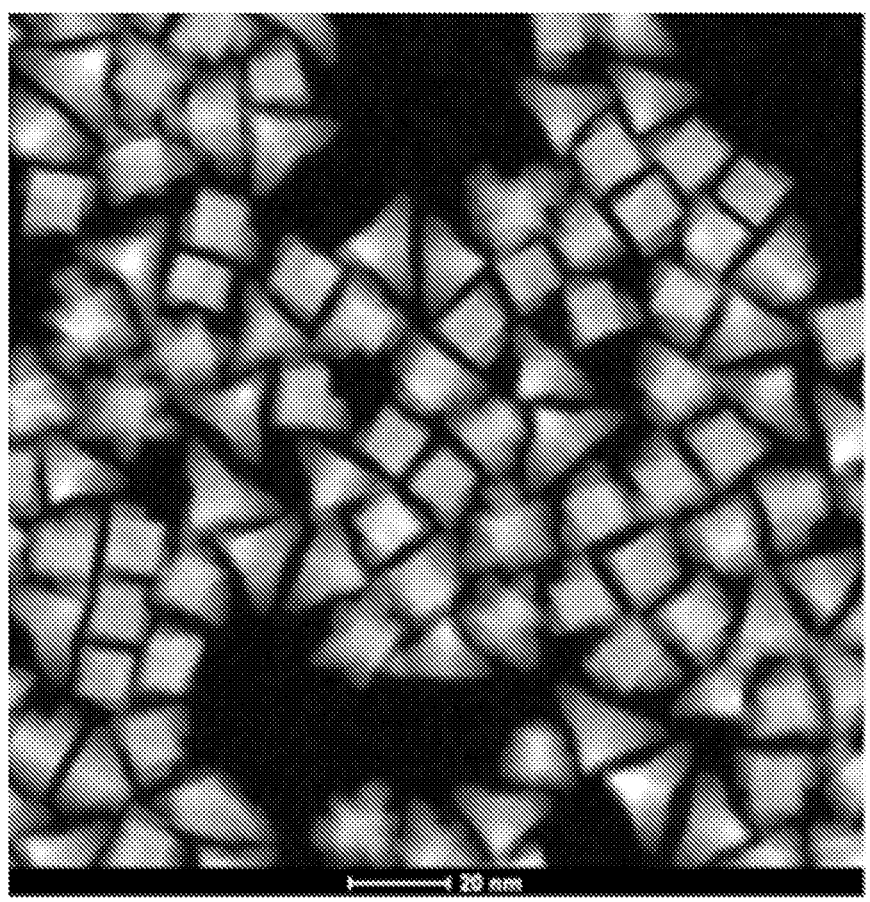
FIG. 4 shows a TEM image of the quantum dot according to Example 4.

UV-Vis spectroscopy, a photoluminescence analysis, and a transmission electron microscopic analysis of the nanocrystal (core/shell) are performed, and the results are shown in FIG. 4 and Table 3.

Referring to the photoluminescence analysis result, the quantum dots may exhibit a maximum emission peak of 452 nm (a full width at half maximum (FWHM): 17 nm) and quantum efficiency of 80%. In other words, the quantum dots emit blue light, and have excellent light emitting characteristics of high quantum efficiency and a narrow full width at half maximum (FWHM) are exhibited.

Referring to the TEM image of FIG. 4, the quantum dots have a cubic shape. In addition, the quantum dots have a particle diameter ranging from about 13.5 nm±1.0 nm (7%).

Inductively coupled plasma atomic emission spectroscopy of the ZnTeSe core and the ZnTeSe (core)/ZnSeS/ZnS (shell) is performed, and the results are listed as a mole ratio relative to Zn in Table 3.

Example 5: Preparation of ZnTeSe Core/ZnSe/ZnS Shell Quantum Dot 0.5 mole of ZnF2 is added to 100 mL of squalene in a flask at room temperature, and vacuum-treated at 120° C. for 10 minutes. The inside of the flask is filled with nitrogen ($N_2$), and the reaction temperature is raised to 180° C. Subsequently, the ZnTeSe core prepared in Synthesis Example 2-2 (reaction time: 60 minutes) is added to the flask within 10 seconds, 0.5 mmole of Se/TOP is subsequently slowly added to the flask, and the reaction temperature is raised to 280° C. Then, 0.7 mmole of S/TOP is added, and the reaction temperature is raised to 350° C. for 10 minutes. Subsequently, a mixed solution of 0.5 mmole of Se/TOP and 0.9 mmole of S/TOP is slowly added, and reacted for 20 minutes. Lastly, a mixed solution of 0.5 mmole of Se/TOP and 1.2 mmole of S/TOP is slowly added, and reacted for 20 minutes.

After the reaction is completed, the reactor is cooled, and the prepared nanocrystals are centrifuged with ethanol and dispersed in toluene.

Figure 5:
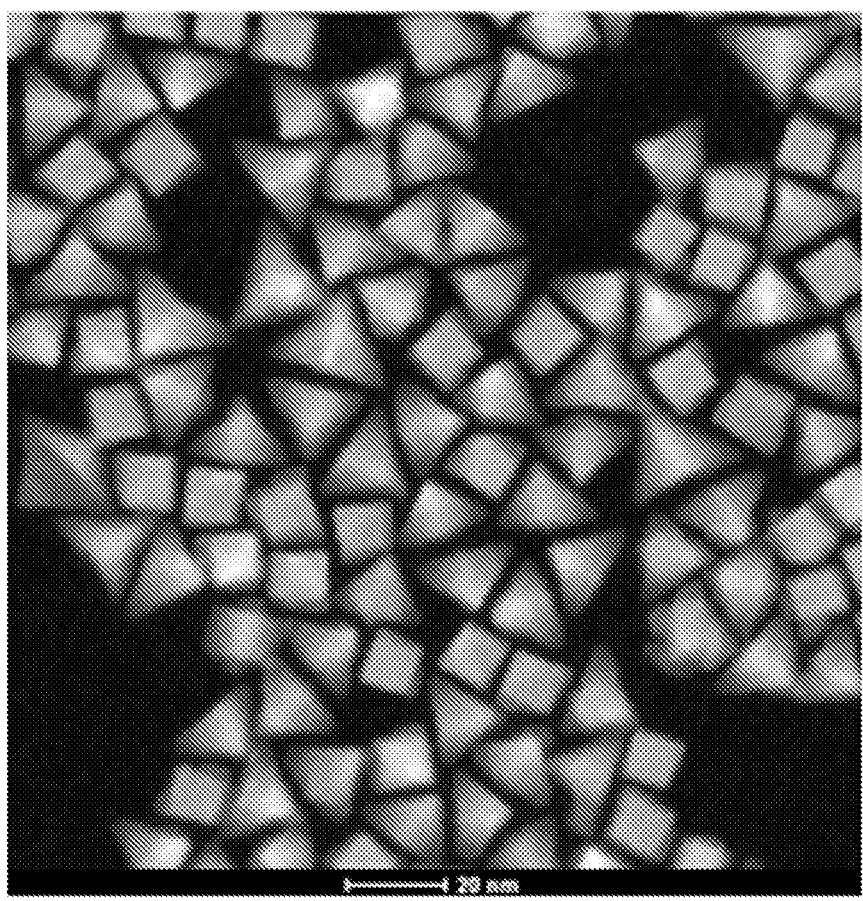
FIG. 5 shows a TEM image of the quantum dot according to Example 5.

UV-vis spectroscopy, a photoluminescence analysis, and a transmission electron microscopic analysis of the nanocrystal (core/shell) are performed, and the results are shown in FIG. 5 and Table 3.

Referring to the photoluminescence analysis result, the quantum dots exhibit a maximum emission peak of 453 nm (a full width at half maximum (FWHM): 18 nm) and quantum efficiency of 76%. In other words, the quantum dots emit blue light, and excellent light emitting characteristics of high quantum efficiency and a narrow full width at half maximum (FWHM) are shown.

Referring to the TEM image of FIG. 5, the quantum dots mostly have a cubic shape. In addition, the quantum dots have a particle diameter ranging from about 13.3 nm±1.3 nm (10%).

Inductively coupled plasma atomic emission spectroscopy of the ZnTeSe core and the ZnTeSe (core)/ZnSeS/ZnS (shell) is performed, and the results are listed as a mole ratio relative to Zn in Table 3.

TABLE 3

| | Rxn. temp. | Core | PL (@372) | A. QY (H Co., Ltd.) | Zn | Se | S | (Se + S)/Zn | S/Se |
|---|---|---|---|---|---|---|---|---|---|
| Ex. 3 | 320° C. | Syn. Ex. 1 | 451 | 21 | 82 | 4.05 | 1.5 | 2.8 | 1.06 | 1.87 |
| Ex. 4 | 340° C. | | 452 | 17 | 80 | 4.05 | 1.5 | 2.8 | 1.06 | 1.87 |
| Ex. 5 | 350° C. | Syn. Ex. 2-2 | 453 | 18 | 76 | 4.05 | 1.5 | 2.8 | 1.06 | 1.87 |

Examples 6 and 7: Preparation of ZnTeSe Core/ZnSe/ZnS Shell Quantum Dot

The ZnTeSe core/ZnSe/ZnS shell quantum dots are prepared according to the same method as Example 3 except that when each of the Se-TOP and S-TOP is added to the reaction flask three separate times to form a shell, the total reaction time is divided into five time intervals, and the reaction temperature is maintained at 340° C. from the first time interval to the third time interval, and at 320° C. (Example 6) or 340° C. (Example 7) in the last two time intervals. UV-Vis spectroscopy and a photoluminescence analysis of the prepared ZnTeSe core/ZnSe/ZnS shell quantum dots are performed, and the results are shown in Table 4.

Referring to the photoluminescence analysis result, the semiconductor nanocrystal particles according to Example 6 exhibit a maximum emission peak of 452 nm (a full width at half maximum (FWHM) of 16 nm) and quantum efficiency of 86%. The quantum dots according to Example 7 exhibit a maximum emission peak of 453 nm (a full width at half maximum (FWHM) of 17 nm) and quantum efficiency of 81%. In other words, the quantum dots of Examples 6 and 7 emit blue light, and exhibit excellent light emitting characteristics of high quantum efficiency and a narrow full width at half maximum (FWHM). In addition, inductively coupled plasma atomic emission spectroscopy of the ZnTeSe core and the ZnTeSe (core)/ZnSeS/ZnS (shell) is performed, and the results (a mole ratio relative to Zn) are shown in Table 4.

Figure 6:
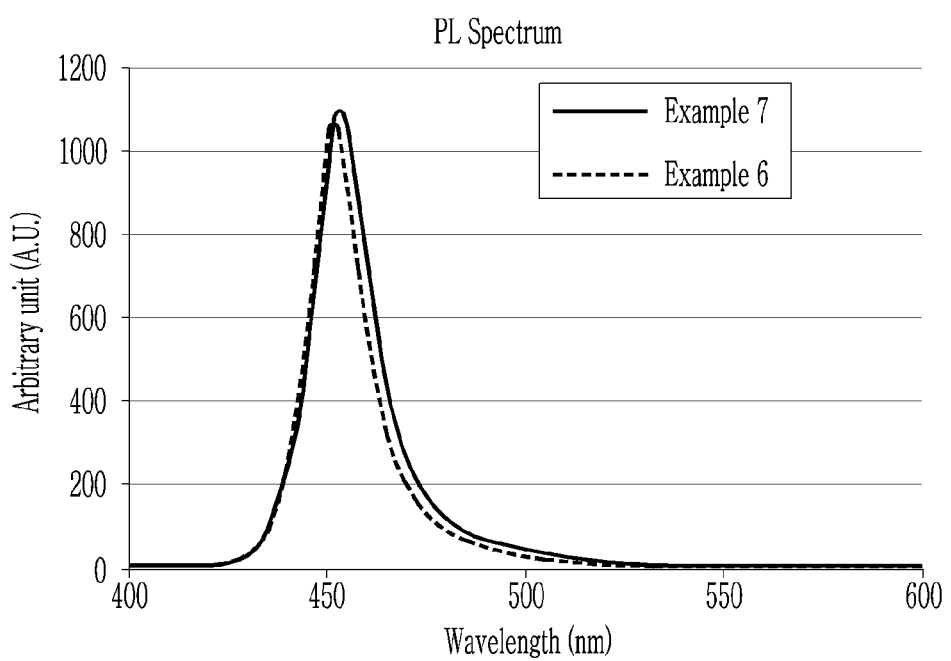
FIG. 6 shows PL spectra of the quantum dots according to Examples 6 and 7.
Figure 7:
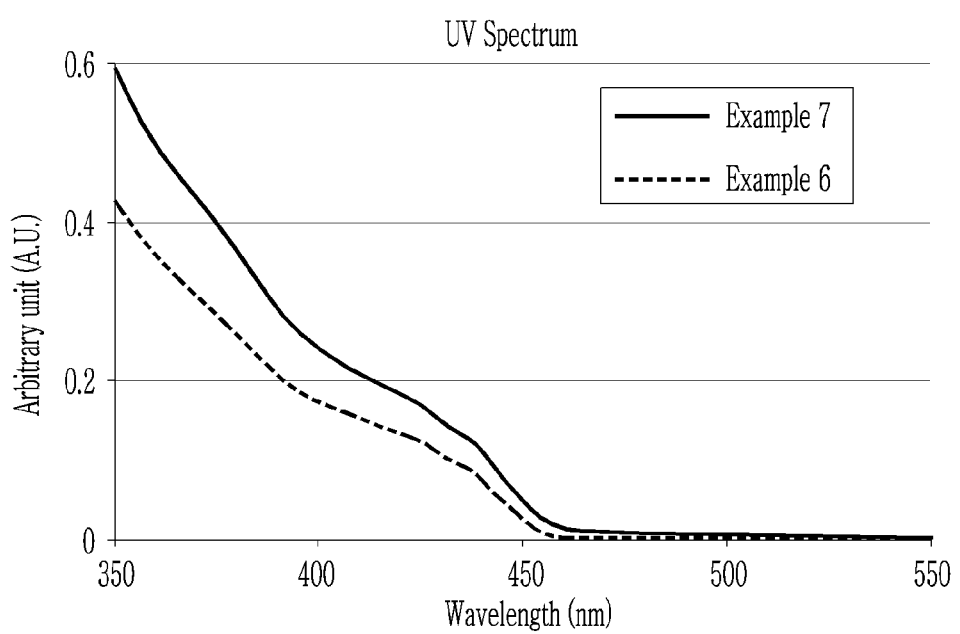
FIG. 7 shows UV-Vis spectra of the quantum dots according to Examples 6 and 7.

In addition, PL spectra of the quantum dots according to Examples 6 and 7 are shown in FIG. 6, and UV-Vis spectra thereof are shown in FIG. 7.

TABLE 4

| | Core | PL (@372) | A. QY (H Co., Ltd.) | Zn | Se | S | (Se + S)/Zn | S/Se |
|---|---|---|---|---|---|---|---|---|
| Ex. 6 | Syn. Ex.1 | 452 | 16 | 86 | 4.05 | 1.5 | 2.8 | 1.06 | 1.87 |
| Ex. 7 | | 453 | 17 | 81 | 4.05 | 1.5 | 2.8 | 1.06 | 1.87 |

Comparative Example 1: Preparation of ZnTeSe Core/ZnS Shell Quantum Dot without ZnF$_2$ 0.6 mmole (0.336 g) of zinc acetate, 3.6 mmole (1.134 g) of oleic acid, and 10 mL of trioctylamine are added to a flask and the reaction mixture is heated under vacuum at 120° C. for 10 minutes. The inside of the flask is filed with nitrogen (N$_2$), and the reaction temperature is raised to 180° C. Then, the ZnTeSe core prepared in Synthesis Example 1 (reaction time: 60 minutes) is added to the reaction flask within 10 seconds, 0.9 mmole of Se/TOP and 0.9 mmole of S/TOP are subsequently added to the flask, and the reaction temperature is raised to 340° C. and reacted for 10 minutes. Subsequently, a mixed solution of zinc acetate and Se/TOP and S/TOP is slowly added in a mole ratio shown in Table 5. A mixed solution of zinc acetate and S/TOP alone is added in the last addition of the total of four additions.

After the reaction is completed, the reactor is cooled, and the prepared nanocrystals are centrifuged with ethanol and dispersed in toluene.

Figure 8:
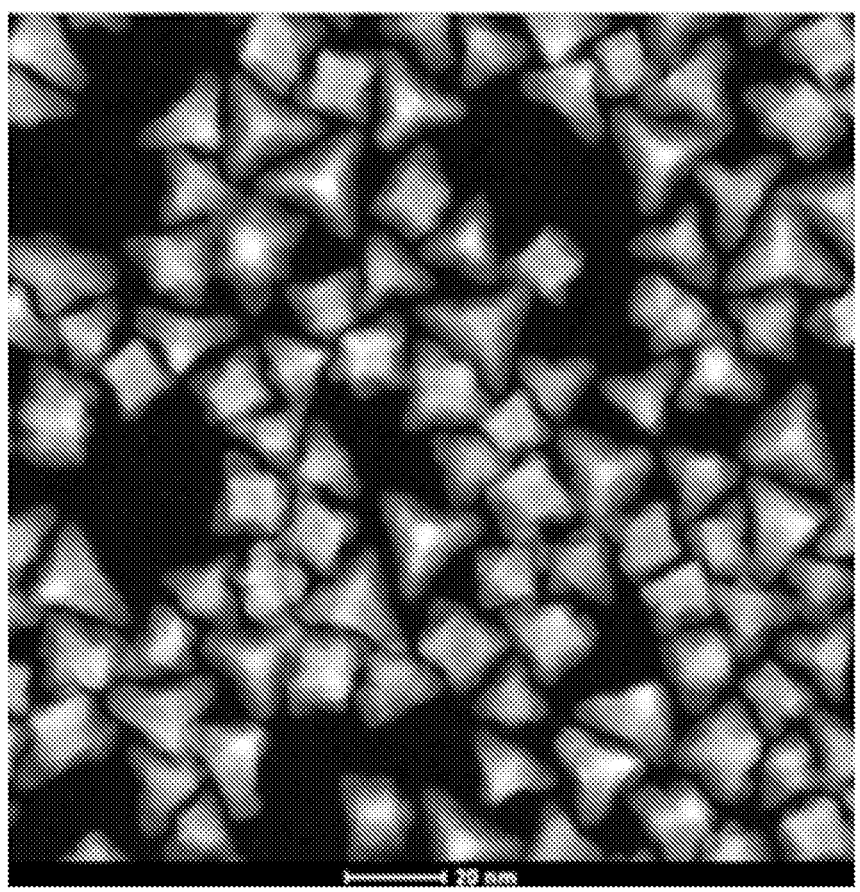
FIG. 8 shows a TEM image of the quantum dot according to Comparative Example 1.

UV-Vis spectroscopy, a photoluminescence analysis, and a transmission electron microscopic analysis of the nanocrystal (core/shell) are performed, and the results are shown in FIG. 8 and Table 5.

Referring to the photoluminescence analysis result, the quantum dots exhibit a maximum emission peak of 451 nm (a full width at half maximum (FWHM): 22 nm) and quantum efficiency of 77%. In other words, a method of preparing a semiconductor nanocrystal in which a ZnS shell is formed on a ZnTeSe core without adding ZnF$_2$ shows excellent quantum efficiency, but a full width at half maximum (FWHM) of greater than 20 nm. Accordingly, the semiconductor nanocrystal prepared from the method does not produce a light emitting device with high color reproducibility.

In addition, referring to the TEM image of FIG. 8, the comparative quantum dots primarily have a multi-pod shape, and the shapes are not as uniform (are of irregular shape). In addition, the quantum dots have a particle diameter ranging from 13.9 nm±1.9 nm (13%).

Inductively coupled plasma atomic emission spectroscopy of the ZnTeSe core and the ZnTeSe (core)/ZnS (shell) is performed, and the results are listed as a mole ratio relative to Zn in Table 5.

Comparative Example 2: Preparation of ZnTeSe Core/ZnS Shell Quantum Dot without ZnF2

A quantum dot having a ZnTeSe core/ZnS shell according to Comparative Example 2 is prepared according to the same as Comparative Example 1 except that the Se/TOP content added in each addition is changed as provided in Table 5.

Figure 9:
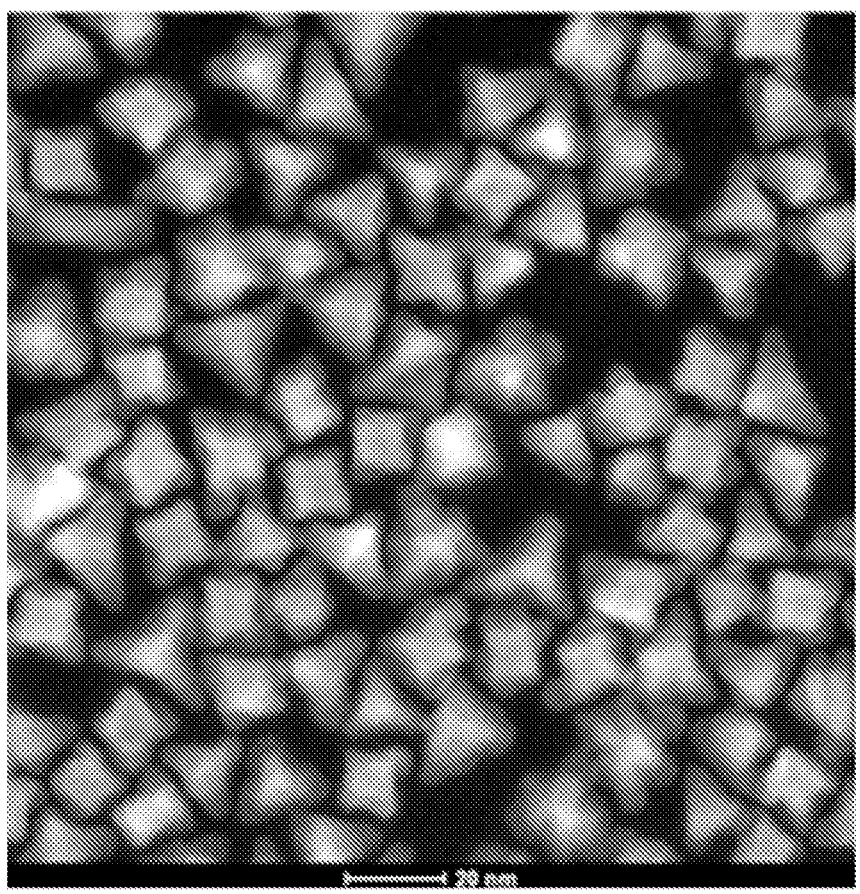
FIG. 9 shows a TEM image of the quantum dot according to Comparative Example 2.

Referring to the TEM image of FIG. 9, the quantum dots have a little irregular shape.

In addition, referring to the photoluminescence analysis result, the quantum dots have a maximum emission peak of 450 nm (a full width at half maximum (FWHM): 27 nm) and quantum efficiency of 60%. In other words, the semiconductor nanocrystals prepared by forming a ZnS shell on a ZnTeSe core without adding ZnF$_2$ exhibit a peak emission wavelength range shifted toward a somewhat shorter blue wavelength, a significantly lower quantum efficiency, and a significantly greater full width at half maximum (FWHM) of 27 nm, i.e., relatively poor light emitting characteristics.

Inductively coupled plasma atomic emission spectroscopy of the ZnTeSe core and the ZnTeSe (core)/ZnS (shell) is performed, and the results are listed as a mole ratio relative to Zn in Table 5.

Comparative Example 3: Preparation of ZnTeSe Core/ZnS Shell Quantum Dot without ZnF$_2$ A quantum dot having the ZnTeSe core and the ZnSe/ZnS shell according to Comparative Example 3 is prepared according to the same method as Comparative Examples 1 or 2, except that the ratio of the zinc precursor and the sulfur precursor added in each section is changed as provided in Table 5. Referring to the photoluminescence analysis result, the semiconductor nanocrystal particles exhibit a maximum emission peak of 449 nm (a full width at half maximum (FWHM): 33 nm) and quantum efficiency of 43%, i.e., light emitting characteristics that are not favorable even compared to those of Comparative Example 2.

Figure 10:
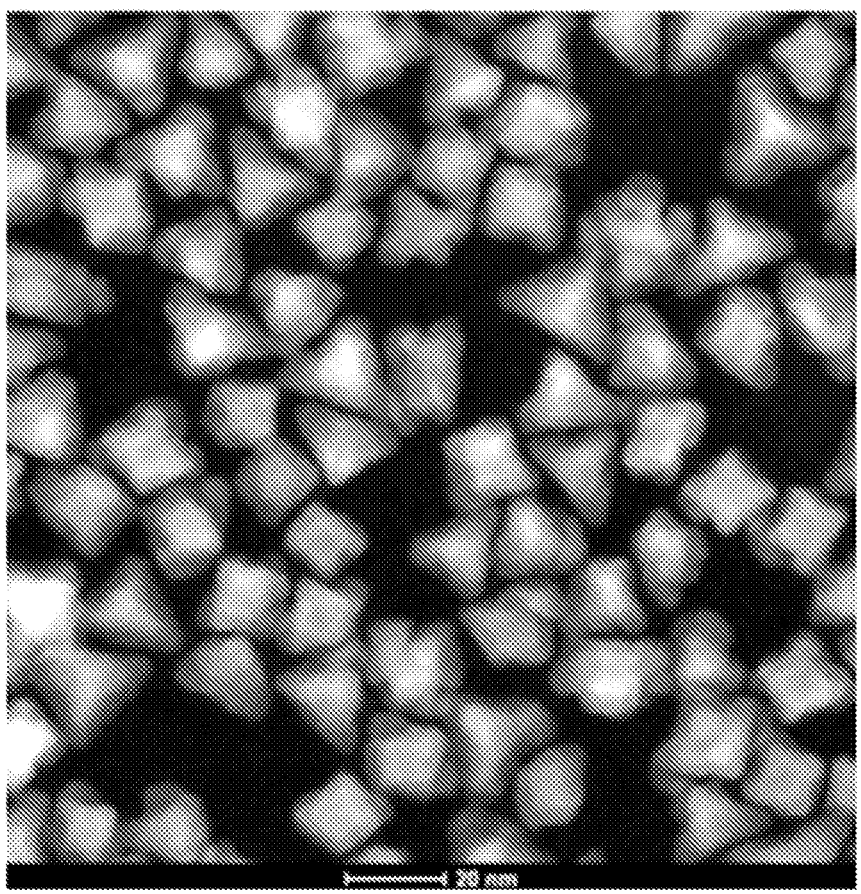
FIG. 10 shows a TEM image of the quantum dot according to Comparative Example 3.

In addition, referring to the TEM image of FIG. 10, the quantum dots have a particle size of 15.7 nm±1.4 nm (13%), and are of considerably irregular shape.

A result of performing inductively coupled plasma atomic emission spectroscopy of the ZnTeSe core and ZnTeSe (core)/ZnS (shell), i.e., a mole ratio relative to Zn, is shown in Table 5.

TABLE 5

| | Core | ZnSe-ZnS-final 80 ml 340° C. | PL (@372) | A. QY (B.C.) | Zn | Se | S | (Se + S)/Zn | TEM Size |
|---|---|---|---|---|---|---|---|---|---|
| Comp. Ex. 1 | Syn. Ex. 1 | S: 0.9-0.9-1.0-1.2, Zn: 0.6-0.75-0.75-0.75, Se: 0.9-0.96-0.96 | 451 | 22 | 77 | 5.67 | 1.5 | 4.0 | 0.97 | 13.9 |
| Com. Exa. 2 | | S: 0.9-0.9-1.0-1.0-1.2, Zn: 0.6-0.75-0.75-0.75, Se: 0.8-0.8-0.83-0.83 | 450 | 27 | 60 | 6.11 | 1.5 | 5.0 | 1.06 | 14.5 |

TABLE 5-continued

| | Core | ZnSe-ZnS-final 80 ml 340° C. | PL (@372) | A. QY (B.C.) | Zn | Se | S | (Se + S)/Zn | TEM Size |
|---|---|---|---|---|---|---|---|---|---|
| Com. Exa. 3 | | S: 0.9-0.9-1.0-1.0-1.0-1.0-1.2, Zn: 0.6-0.75-0.75-0.75, Se: 0.8-0.8-0.85-0.9-0.9-0.9 | 449 | 33 | 43 | 8.00 | 1.5 | 7.0 | 1.06 | 15.7 |

Comparative Examples 4 and 5: Preparation of ZnTeSe Core/ZnS Shell Quantum Dot Using other Metal Fluoride except $ZnF_2$ A quantum dot having a ZnTeSe core/a ZnSe/ZnS shell is prepared under a similar condition to that of Example 3, but Comparative Example 4 includes 0.35 mole of $AlF_3$ instead of $ZnF_2$ at room temperature, and Comparative Example 5 includes 1.06 mole of LiF instead of $ZnF_2$ at room temperature.

As a result, Comparative Examples 4 and 5 as shown in Table 6, the quantum dots prepared by including $AlF_3$ or LiF instead of $ZnF_2$ respectively exhibit a shorter emission peak wavelength of 442 nm and 443 nm, respectively, and also, luminous efficiency decreased to 50%. In other words, when the metal of the metal fluoride is not Zn, the resulting prepared quantum dots exhibit light emitting characteristics that are very different than the quantum dots prepared by including $ZnF_2$ or a precursor thereof, zinc-carboxylate, or a fluorine ion source.

Figure 11:
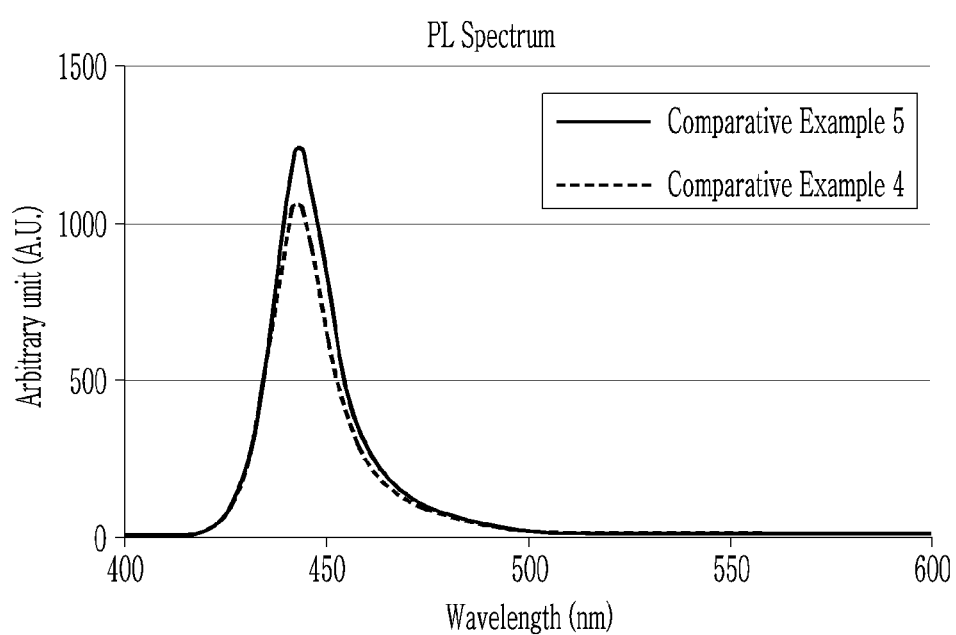
FIG. 11 shows PL spectra of the quantum dots according to according to Comparative Examples 4 and 5.
Figure 12:
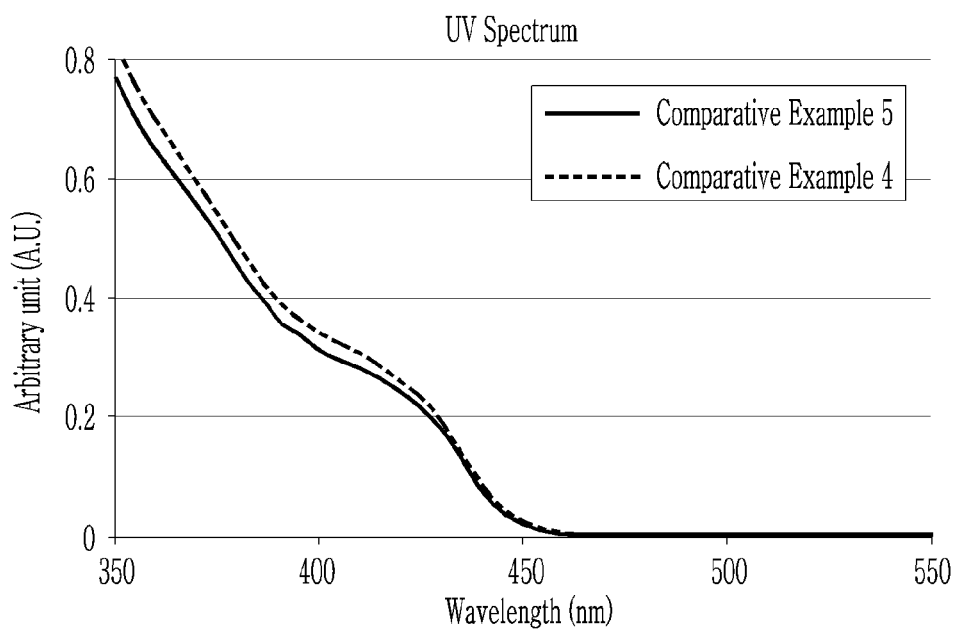
FIG. 12 shows UV-Vis spectra of the quantum dots according to Comparative Examples 4 and 5.

The photoluminescence (PL) spectra for the quantum dots of Comparative Examples 4 and 5 are shown in FIG. 11, and the UV-Vis spectra thereof are shown in FIG. 12.

TABLE 6

| | Core | ZnSe-ZnS-final 80 ml scale, 340° C. | PL (@372) | A. QY (H Co., Ltd.) | Zn | Se | S | (Se + S)/Zn | S/Se |
|---|---|---|---|---|---|---|---|---|---|
| Comp. Ex.4 | Syn. Ex. 1 | Se: 0.5-0.5-0.5, S: 0.7-0.9-1.2, Zn: 0.6-0.75-0.75-0.75-0.6-0.6, addition 0.35 of $AlF_3$ at room temperature | 442 | 16 | 50 | 4.05 | 1.5 | 2.8 | 1.06 | 1.87 |
| Comp. Ex. 5 | | Se: 0.5-0.5-0.5, S: 0.7-0.9-1.2, Zn: 0.6-0.75-0.75-0.75-0.6-0.6, addition 1.06 of LiF at room temperature | 443 | 17 | 52 | 4.05 | 1.5 | 2.8 | 1.06 | 1.87 |

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A method for preparing a core-shell quantum dot, comprising providing a core comprising a first semiconductor nanocrystal comprising zinc and selenium, and optionally sulfur and/or tellurium,
   providing (i) a first solution comprising zinc-carboxylate, a fluorine ion source, and a solvent, or (ii) a second solution comprising $ZnF_2$ and a solvent,
   adding the core to the first solution or the second solution to provide a first core solution or a second core solution, respectively, and
   adding at least one of a sulfur-containing precursor or a selenium-containing precursor, to the first core solution or the second core solution, and allowing the core solutions to react,
   wherein the core-shell quantum dot has an average particle diameter of greater than or equal to about 13 nanometers, an emission peak wavelength in a range of about 440 nanometers to about 470 nanometers, and a full width at half maximum (FWHM) of an emission wavelength of less than about 25 nanometers, and
   the core-shell quantum dot exhibits a quantum efficiency of greater than or equal to about 70%, and the core-shell quantum dot is cadmium-free.

2. The method of claim 1, wherein the fluorine ion source of the first solution comprises $ZnF_2$, HF, $NH_4F$, LiF, NaF, KF, $BeF_2$, $MgF_2$, $CaF_2$, $SrF_2$, CuF, AgF, AuF, $HgF_2$, $AlF_3$, $GaF_3$, $InF_3$, $SnF_2$, $PbF_2$, or a combination thereof.

3. The method of claim 1, wherein the second solution further comprises a zinc precursor in addition to the $ZnF_2$.

4. The method of claim 3, wherein the zinc precursor comprises dimethyl zinc, diethyl zinc, zinc acetate, zinc acetylacetonate, zinc iodide, zinc bromide, zinc chloride, zinc carbonate, zinc cyanide, zinc nitrate, zinc oxide, zinc peroxide, zinc perchlorate, zinc sulfate, or a combination thereof.

5. The method of claim 1, wherein the zinc-carboxylate of the first solution comprises zinc-oleate, zinc palmitate, zinc stearate, zinc octanoate, or a combination thereof.

6. The method of claim 1, wherein a content of the zinc-carboxylate included in the first solution, or a content of the $ZnF_2$ included in the second solution, accounts for less than or equal to about 20 mole percent zinc based on a total moles of zinc in the quantum dot.

7. The method of claim 1, wherein when the core is added to the second solution, an additional zinc precursor is added to the second core solution after the core is added.

8. The method of claim 1, wherein the adding of the core to the first solution or the second solution undergoes a first reaction, and the adding of the at least one of the sulfur-containing precursor or the selenium-containing precursor to the first core solution or the second core solution undergoes a second reaction.

9. The method of claim 1, wherein the first solution or second solution further comprises a ligand compound.

10. The method of claim 9, wherein the ligand compound comprises RCOOH, $RNH_2$, $R_2NH$, $R_3N$, RSH, $R_3PO$, $R_3P$, ROH, RCOOR', $RPO(OH)_2$, $R_2POOH$, or a combination thereof, wherein R and R' are independently a C1 to C24 aliphatic hydrocarbon group, or a C5 to C20 aromatic hydrocarbon group.

11. The method of claim 1, wherein the adding of at least one of the sulfur-containing precursor or the selenium-containing precursor to the first or the second core solution is performed when the first or the second core solution is at a temperature of about 300° C. to about 350° C.

12. The method of claim 1, wherein the core-shell quantum dot has an emission peak wavelength in a range of about 445 nanometers to about 460 nanometers.

13. The method of claim 1, wherein the core-shell quantum dot exhibits a quantum efficiency of greater than or equal to about 80%.

14. The method of claim 1, wherein the first semiconductor nanocrystal comprises zinc and selenium, or zinc, selenium, and tellurium.

15. The method of claim 1, wherein the sulfur-containing precursor comprises a sulfur powder, hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bis(trimethylsilyl) sulfide, ammonium sulfide, sodium sulfide, or a combination thereof.

16. The method of claim 1, wherein the selenium-containing precursor comprises selenium, selenium-trioctylphosphine (Se-TOP), selenium-tributylphosphine (Se-TBP), selenium-triphenylphosphine (Se-TPP), or a combination thereof.

17. The method of claim 1, wherein a ratio of total moles of sulfur and selenium relative to the moles of zinc in the second semiconductor nanocrystal is about 1 to about 2.

18. The method of claim 1, wherein the method further comprises adding a nonsolvent to the first or the second core solution after completion of the reaction between the core and the at least one of the sulfur-containing precursor or the selenium-containing precursor to separate the core-shell quantum dot.

19. The method of claim 18, wherein the nonsolvent comprises acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing solvents, or a combination thereof.

* * * * *